(12) United States Patent
Chu et al.

(10) Patent No.: US 11,037,898 B2
(45) Date of Patent: Jun. 15, 2021

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventors: Ming Hsien Chu, Kaohsiung (TW); Chi-Yu Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/358,616

(22) Filed: Mar. 19, 2019

(65) Prior Publication Data
US 2020/0303335 A1 Sep. 24, 2020

(51) Int. Cl.
| | |
|---|---|
| H01L 23/48 | (2006.01) |
| H01L 23/52 | (2006.01) |
| H01L 29/40 | (2006.01) |
| H01L 23/00 | (2006.01) |
| H01L 23/498 | (2006.01) |
| H01L 23/31 | (2006.01) |
| H01L 23/66 | (2006.01) |
| H01L 21/683 | (2006.01) |
| H01L 21/56 | (2006.01) |
| H01L 21/48 | (2006.01) |

(52) U.S. Cl.
CPC .......... *H01L 24/20* (2013.01); *H01L 21/4857* (2013.01); *H01L 21/568* (2013.01); *H01L 21/6835* (2013.01); *H01L 23/3128* (2013.01); *H01L 23/3135* (2013.01); *H01L 23/49822* (2013.01); *H01L 23/49838* (2013.01); *H01L 23/66* (2013.01); *H01L 24/19* (2013.01); *H01L 2221/68345* (2013.01); *H01L 2221/68359* (2013.01); *H01L 2223/6677* (2013.01); *H01L 2224/211* (2013.01); *H01L 2224/221* (2013.01); *H01L 2924/3511* (2013.01)

(58) Field of Classification Search
CPC ..... H01L 2224/73265; H01L 2924/181; H01L 2224/48227; H01L 24/16; H01L 24/13; H01L 2224/12105; H01L 23/5389; H01L 24/96; H01L 21/56; H01L 24/48; H01L 23/48; H01L 24/05; H01L 23/3121; H01L 24/81; H01L 25/0657; H01L 23/49822; H01L 24/32; H01L 21/565; H01L 23/53295; H01L 24/17
USPC ........................................................ 257/773
See application file for complete search history.

(56) References Cited

U.S. PATENT DOCUMENTS

| | | | |
|---|---|---|---|
| 2011/0186980 A1* | 8/2011 | Lin ...................... | H01Q 1/2283 257/690 |
| 2017/0345807 A1* | 11/2017 | Yu ........................... | H01L 24/20 |
| 2018/0166405 A1 | 6/2018 | Chiang et al. | |

* cited by examiner

*Primary Examiner* — Theresa T Doan
(74) *Attorney, Agent, or Firm* — Foley & Lardner LLP

(57) ABSTRACT

A semiconductor device package includes a first electronic device and a second electronic device. The first electronic device includes a first redistribution layer (RDL) including a circuit layer. The second electronic device is disposed on the first RDL of the first electronic device. The second electronic device includes an encapsulant and a patterned conductive layer. The encapsulant has a first surface facing the first RDL of the first electronic device, and a second surface opposite to the first surface. The patterned conductive layer is disposed at the second surface of the encapsulant, and is configured to be electrically coupled to the circuit layer of the first RDL of the first electronic device.

16 Claims, 23 Drawing Sheets

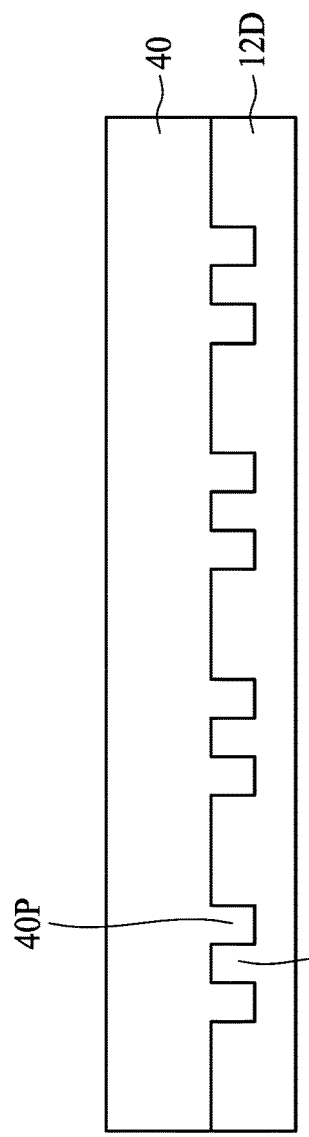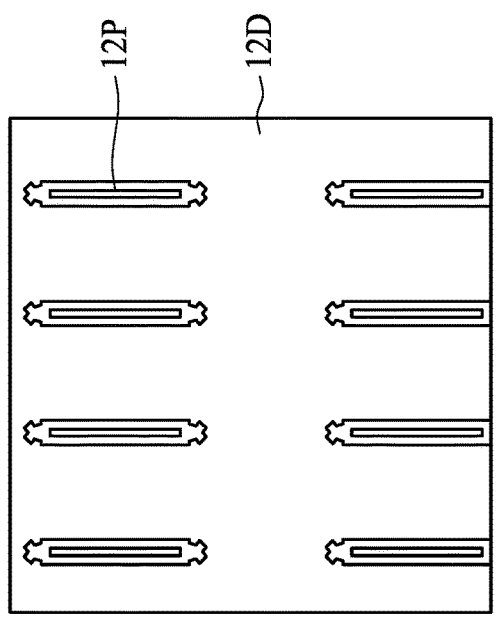
FIG. 1B
FIG. 1A

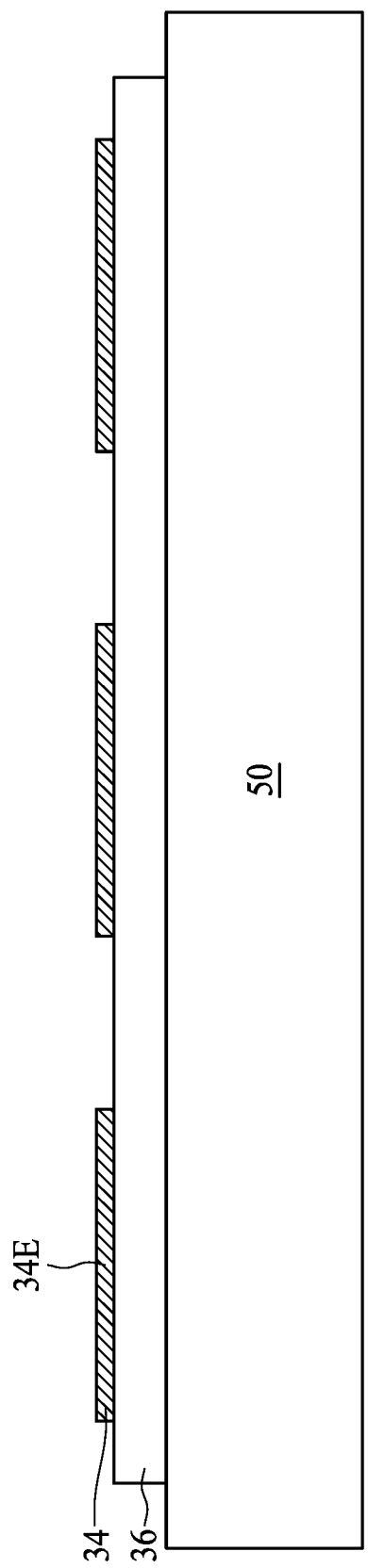

SEMICONDUCTOR DEVICE PACKAGE AND METHOD FOR MANUFACTURING THE SAME

BACKGROUND

1. Technical Field

The present disclosure relates to a semiconductor device package and a method for manufacturing the same, and to a semiconductor device package including two or more stacked molded structures and a method for manufacturing the same.

2. Description of the Related Art

A stacked semiconductor device package may include two or more stacked electronic devices. The electronic devices are formed on a substrate (e.g., a wafer). Each of the electronic devices may be molded during fabrication, and thus at least two molding operations may be performed on at least one of the electronic devices. A substrate and one or more overlying layers may suffer from warpage due to a coefficient of thermal expansion (CTE) mismatch of molding materials during the two or more molding operations, which can be carried out at high temperature. The warpage can cause poor alignment between the electronic devices. Thus, warpage may be an issue for stacked semiconductor device packages.

SUMMARY

In some embodiments, a semiconductor device package includes a first electronic device and a second electronic device. The first electronic device includes a first redistribution layer (RDL) including a circuit layer. The second electronic device is disposed on the first RDL of the first electronic device. The second electronic device includes an encapsulant and a patterned conductive layer. The encapsulant has a first surface facing the first RDL of the first electronic device, and a second surface opposite to the first surface. The patterned conductive layer is disposed at the second surface of the encapsulant, and is configured to be electrically coupled to the circuit layer of the first RDL of the first electronic device.

In some embodiments, a semiconductor device package includes a first electronic device, a second electronic device and an intermediate layer. The first electronic device includes an RDL including a circuit layer and an upper dielectric layer covering the circuit layer. The second electronic device is disposed on the first electronic device. The second electronic device includes an encapsulant and a patterned conductive layer. The encapsulant has a first surface, and a second surface opposite to the first surface. The patterned conductive layer is disposed at the first surface of the encapsulant. The intermediate layer is disposed between the upper dielectric layer of the RDL of the first electronic device and the second surface of the encapsulant, and configured to bond the first electronic device and the second electronic device.

In some embodiments, a method for manufacturing a semiconductor device package includes the following operations. A first molded structure is formed. The first molded structure includes a first carrier, a patterned conductive layer disposed on the first carrier, and a first encapsulant disposed on the first carrier and encapsulating the patterned conductive layer. A second molded structure is formed. The second molded structure includes a second carrier, a semiconductor chip, a second encapsulant and an RDL. The semiconductor chip is disposed on the second carrier. The second encapsulant is disposed on the second carrier and encapsulates the semiconductor chip. The RDL is disposed on the second encapsulant. The first molded structure is bonded to the second molded structure by an adhesive layer with the first encapsulant facing the RDL.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

FIG. 1A is a top view of an upper dielectric layer of a first RDL of FIG. 1 in accordance with some embodiments of the present disclosure.

FIG. 1B is a cross-sectional view of an upper dielectric layer and an intermediate layer of FIG. 1 in accordance with some embodiments of the present disclosure.

FIG. 2A, FIG. 2B, FIG. 2C, FIG. 2D, FIG. 2E, FIG. 2F, FIG. 2G, FIG. 2H, FIG. 2I, FIG. 2J and FIG. 2K illustrate operations of manufacturing a semiconductor device package in accordance with some embodiments of the present disclosure.

DETAILED DESCRIPTION

Figure 1:
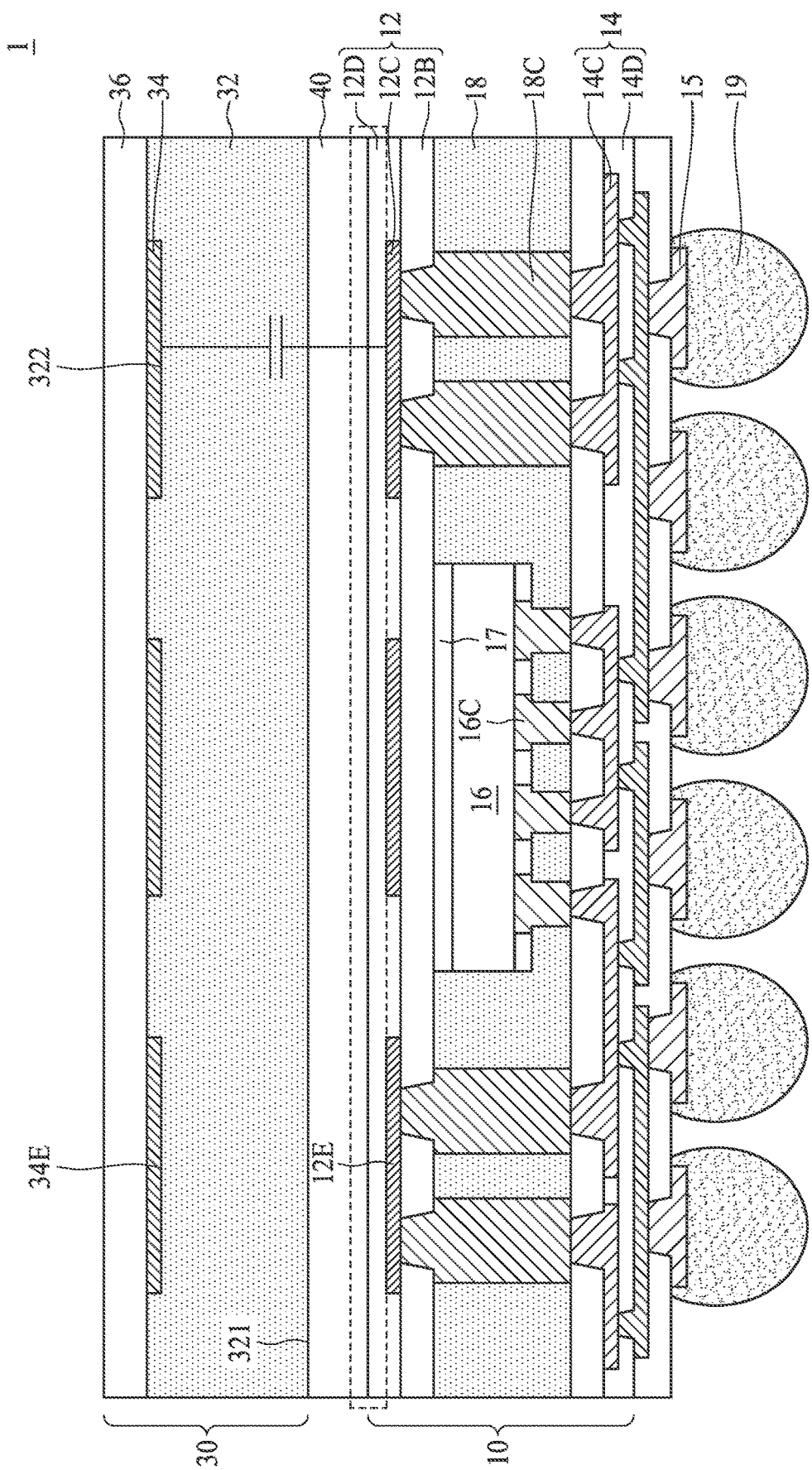
FIG. 1 is a cross-sectional view of a semiconductor device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

The present disclosure provides for a semiconductor device package and a method for manufacturing the same. The semiconductor device package includes two or more stacked electronic devices. The electronic devices may be molded structures, which are molded individually before they are bonded, and therefore each of the molded structures may be subjected to one molding operation. Accordingly, subjecting the electronic devices to two or more high temperature molding operations can be avoided. Therefore, warpage issues can be alleviated or avoided, and the electronic devices can accordingly be well aligned with each other.

FIG. 1 is a cross-sectional view of a semiconductor device package 1 in accordance with some embodiments of the present disclosure. As shown in FIG. 1, the semiconductor device package 1 includes a first electronic device 10 and a second electronic device 30 stacked on the first electronic device 10. The first electronic device 10 includes an RDL 12 (also referred to as a first RDL). The first RDL 12 includes a circuit layer 12C, and dielectric layers such as an upper dielectric layer 12D disposed on the circuit layer 12C, and a bottom dielectric layer 12B disposed under the circuit layer 12C. The circuit layer 12C may be single-layered or multi-layered, and the material of the circuit layer 12C may include metal such as copper, an alloy, or other suitable conductive materials. The upper dielectric layer 12D and the bottom dielectric layer 12 each may include an inorganic dielectric layer, or an organic dielectric layer. In some embodiments, the upper dielectric layer 12D may, but need not, substantially completely cover the circuit layer 12C.

In some embodiments, the first electronic device 10 may further include another RDL 14 (also referred to as a second RDL), a semiconductor chip 16 and an encapsulant 18 (also referred to as a second encapsulant). The second RDL 14 is disposed under the first RDL 12 and electrically connected to the first RDL 12. In some embodiments, a surface roughness of the second RDL 14 is less than a surface roughness of the first RDL 12 (e.g., by a factor of about 0.9 or less, by a factor of about 0.8 or less, or by a factor of about 0.7 or less). The second RDL 14 includes, for example, a dielectric layer 14D and a circuit layer 14C disposed on, adjacent to, or embedded in and exposed by the dielectric layer 14D. The second RDL 14 may include a plurality of stacked circuit layers 14C and dielectric layers 14D. The material of the circuit layers 14C may include metal such as copper, an alloy, or other suitable conductive materials. The dielectric layers 14D may include an inorganic dielectric layer, or an organic dielectric layer.

The semiconductor chip 16 is disposed between the first RDL 12 and the second RDL 14. The semiconductor chip 16 includes, for example, an active chip, a passive chip or a combination thereof. The second encapsulant 18 is disposed between the first RDL 12 and the second RDL 14, and the second encapsulant 18 encapsulates the semiconductor chip 16. In some embodiments, the semiconductor chip 16 may be attached to, or may contact, the first RDL 12, and the semiconductor chip 16 includes connection elements 16C such as conductive pillars, conductive studs or conductive bumps facing and electrically connected to the second RDL 14. The second encapsulant 18 includes, for example, a molding material, which may be less expensive compared to other insulative material. By way of example, the molding material may include a polymer resin such as a polyimide, an epoxy resin or the like. The second encapsulant 18 may further include, for example, fillers or particles (e.g. silicon oxide or the like). The fillers or particles embedded in the second encapsulant 18 can alleviate warpage of the second encapsulant 18. The second encapsulant 18 may be substantially opaque (e.g., may block transmission of light by about 80% or more, by about 90% or more, or by about 95% or more). The opaque second encapsulant 18 may block light such as UV light, such that the semiconductor chip 16 may be protected from UV damage.

The first electronic device 10 may further include conductive structures 18C such as conductive pillars disposed in the second encapsulant 18, and through which the first RDL 12 and the second RDL 14 are electrically connected. The first electronic device 10 may further include connectors 19 such as solder bumps electrically connected to the second RDL 14 through conductive pads 15 such as under bump metallurgies (UBMs), and configured for external connection. The conductive pad 15 may be in proximity to, adjacent to or embedded in and exposed by the second RDL 14.

The second electronic device 30 is disposed on the first RDL 12 of the first electronic device 10. The second electronic device 30 includes an encapsulant 32 (also referred to as a first encapsulant) and a patterned conductive layer 34. The first encapsulant 32 has a first surface 321 facing the first RDL 12 of the first electronic device 10, and a second surface 322 opposite to the first surface 321. The first encapsulant 32 includes, for example, a molding material, which may be less expensive compared to other insulative material. By way of example, the molding material may include a polymer resin such as a polyimide, an epoxy resin or the like. The first encapsulant 32 may further include, for example, fillers or particles (e.g. silicon oxide or the like). The fillers or particles embedded in the first encapsulant 32 can alleviate warpage of the first encapsulant 32. The first encapsulant 32 may be opaque (e.g., may block transmission of light by about 80% or more, by about 90% or more, or by about 95% or more). The opaque first encapsulant 32 may block light such as UV light, such that the semiconductor chip 16 may be protected from UV damage.

The patterned conductive layer 34 is disposed at (e.g., on, adjacent to, or embedded in and exposed at) the second surface 322 of the first encapsulant 32. In some embodiments, the second electronic device 30 may further include a passivation layer 36 disposed on the patterned conductive layer 34. The material of the passivation layer 36 includes, for example, an organic material such as a polyimide or the like.

In some embodiments, the first electronic device 10 may include, but is not limited to, a fan-out package, and the second electronic device 30 may include, but is not limited to, an antenna-in package (AIP). The first electronic device 10 and the second electronic device 30 can be other types of electronic devices, chips, semiconductor dies, interposers or the like.

In some embodiments the circuit layer 12C may include or may have an antenna pattern. In some embodiments, the circuit layer 12C of the first electronic device 10 and the patterned conductive layer 34 of the second electronic device 30 may collectively form at least a portion of an antenna. For example, the patterned conductive layer 34 of the second electronic device 30 can be electrically coupled to the circuit layer 12C of the first electronic device 10. As used herein, the term "electrically coupled to" refers to a state in which electrical signals may be capacitively propagated from one conductor to another conductor while the conductors are physically isolated from each other by an insulator or a dielectric layer. In some embodiments, the patterns of the circuit layer 12C and the patterned conductive layer 34 are aligned (e.g., portions of the conductive layer 12C are respectively disposed above portions of the patterned conductive layer 34). By way of example, the circuit layer 12C of the first RDL 12 includes one or more first electrodes 12E, and the patterned conductive layer 34 includes one or more second electrodes 34E substantially aligned with (e.g., respectively disposed above) the first electrodes 12E. In some embodiments, an offset of an edge of the first electrode 12E from a corresponding edge of the second electrode 34E is less than a predetermined value such as about 25 micrometers (or, for example, about 20 micrometers, about 17.5 micrometers, about 15 micrometers, or less), such that electrical signals can be propagated via coupling from the circuit layer 12C to the patterned conductive layer 34, or vice versa. In some embodiments, an offset of an imaginary center line of the first electrode 12E from an imaginary center line of the second electrode 34E is less than a predetermined value such as about 25 micrometers (or, for example, about 20 micrometers, about 17.5 micrometers, about 15 micrometers, or less). In some embodiments, a dielectric constant (Dk) and a dissipation factor (Df) of the first encapsulant 32 and the second encapsulant 18 can be individually specified based on different considerations. By way of example, the dielectric constant (Dk) and/or the dissipation factor (Df) of the first encapsulant 32 disposed between the patterned conductive layer 34 and the circuit layer 12C is lower relative to that of the second encapsulant 18 (e.g., by a factor of about 0.9 or less, by a factor of about 0.8 or less, or by a factor of about 0.7 or less) to mitigate transmission loss.

In some embodiments, the semiconductor device package 1 further includes an intermediate layer 40 disposed between the upper dielectric layer 12D of the first RDL 12 and the first surface 321 of the first encapsulant 32. The intermediate layer 40 may also referred to as an adhesive layer, which is configured to bond the first electronic device 10 and the second electronic device 30 (e.g., during fabrication). The adhesive layer may include glue, double-side tape or the like. The dielectric constant (Dk) and/or the dissipation factor (Df) of the intermediate layer 40, which may be disposed between the patterned conductive layer 34 and the circuit layer 12C, may substantially match with that of the first encapsulant 32 to mitigate transmission loss (e.g., transmission between the patterned conductive layer 34 and the circuit layer 12C).

FIG. 1A is a top view of the upper dielectric layer 12D of the first RDL 12 in accordance with some embodiments of the present disclosure, and FIG. 1B is a cross-sectional view of the upper dielectric layer 12D and the intermediate layer 40 in accordance with some embodiments of the present disclosure. As shown in FIG. 1A and FIG. 1B, the upper dielectric layer 12D may include a plurality of first protrusions 12P, and the intermediate layer 40 may include a plurality of second protrusions 40P engaged with the first protrusions 12P of the upper dielectric layer 12D. In some embodiments, the height of the first protrusions 12P may be, for example, larger than about 1 micrometer (e.g., about 1.5 micrometers or more, about 2 micrometers or more, or about 2.5 micrometers or more). The engaged first protrusions 12P and second protrusions 40P help enhance the adhesion between the upper dielectric layer 12D and the intermediate layer 40, thereby increasing alignment and reliability.

In some embodiments, the patterned conductive layer 34 of the second electronic device 30 can be electrically connected to the circuit layer 12C of the first electronic device 10 (e.g., the patterned conductive layer 34 of the second electronic device 30 can be electrically connected to the circuit layer 12C of the first electronic device 10 through conductive vias or the like, which penetrate through the first encapsulant 32).

Figure 2B:
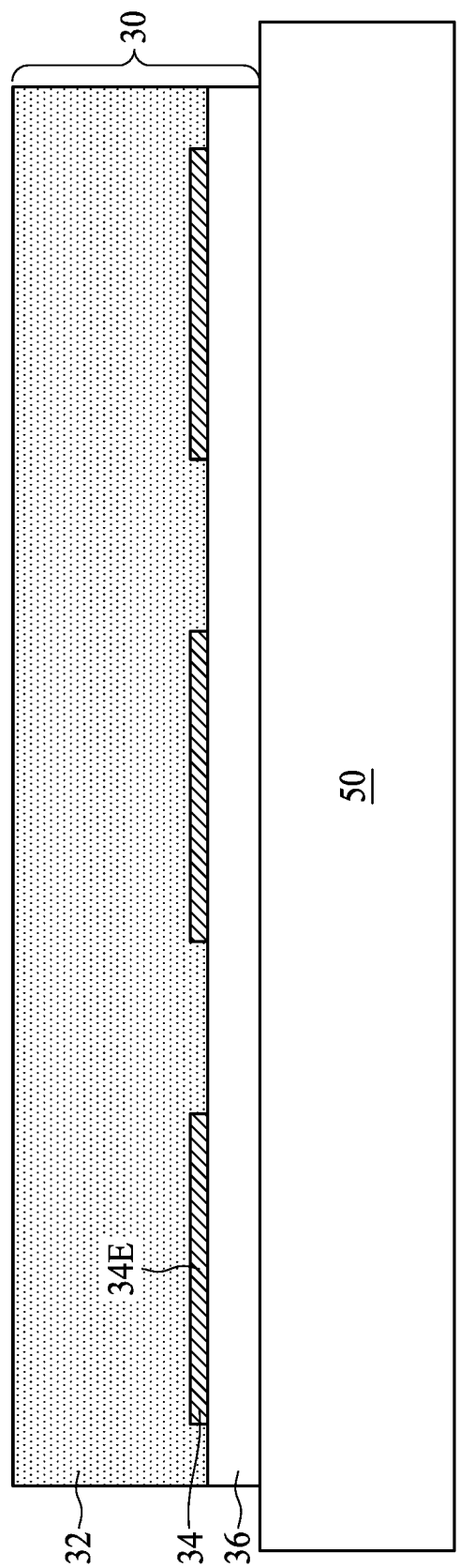

FIG. 2A, FIG. 2B, FIG. 2C, FIG. 2D, FIG. 2E, FIG. 2F, FIG. 2G, FIG. 2H, FIG. 2I, FIG. 2J and FIG. 2K illustrate operations for manufacturing a semiconductor device package in accordance with some embodiments of the present disclosure. Referring to FIG. 2A, a carrier 50 (also referred to as a first carrier) is provided. The carrier 50 may include, for example, a light-permeable carrier (e.g., that is about 80% or more transmissive to light, about 90% or more transmissive to light, or about 95% or more transmissive to light) such as a glass carrier. A patterned conductive layer 34 (e.g., having one or more second electrodes 34E) is formed on the carrier 50. In some embodiments, a passivation layer 36 may be formed on the carrier 50 prior to formation of the patterned conductive layer 34, and the patterned conductive layer 34 may be formed on the passivation layer 36.

Referring to FIG. 2B, an encapsulant 32 (also referred to as a first encapsulant) is formed on the carrier 50 to encapsulate the patterned conductive layer 34. Accordingly, a plurality of second electronic devices 30 (also referred to as a second molded structure) may be formed. Although one second electronic device 30 is shown in FIG. 2B, and the second molded structure may include a plurality of second electronic devices 30. In some embodiments, the first encapsulant 32 is substantially opaque (e.g., may block transmission of light by about 80% or more, by about 90% or more, or by about 95% or more). In some embodiments, the second molded structure may include a flange molding structure, in which a dimension (e.g. length) of the first encapsulant 32 may be smaller (e.g., may be about 95% or less, about 90% or less, or about 85% or less) than that of the carrier 50 such that a periphery of the light-permeable carrier 50 is uncovered by the first encapsulant 32 for facilitating an alignment operation in successive operations. In some embodiments, an alignment mark (not shown) may be formed in the periphery of the carrier 50 uncovered by the first encapsulant 32 for facilitating an alignment operation.

Figure 2C:
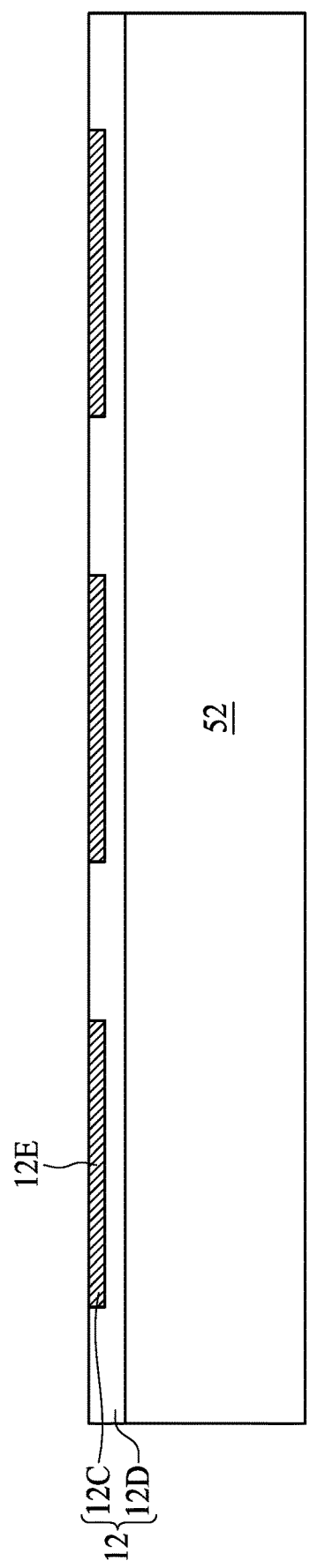

Referring to FIG. 2C, another carrier 52 (also referred to as a third carrier) is provided. The carrier 52 may include, for example, a light-permeable carrier (e.g., that is about 80% or more transmissive to light, about 90% or more transmissive to light, or about 95% or more transmissive to light) such as a glass carrier. An RDL 12 (also referred to as a first RDL) is formed on the carrier 52. In some embodiments, the first RDL 12 includes, for example, a circuit layer 12C and a dielectric layer 12D (also referred to an upper dielectric layer). In some embodiments, other circuit layer(s) and/or dielectric layer(s) may be formed.

Figure 2D:
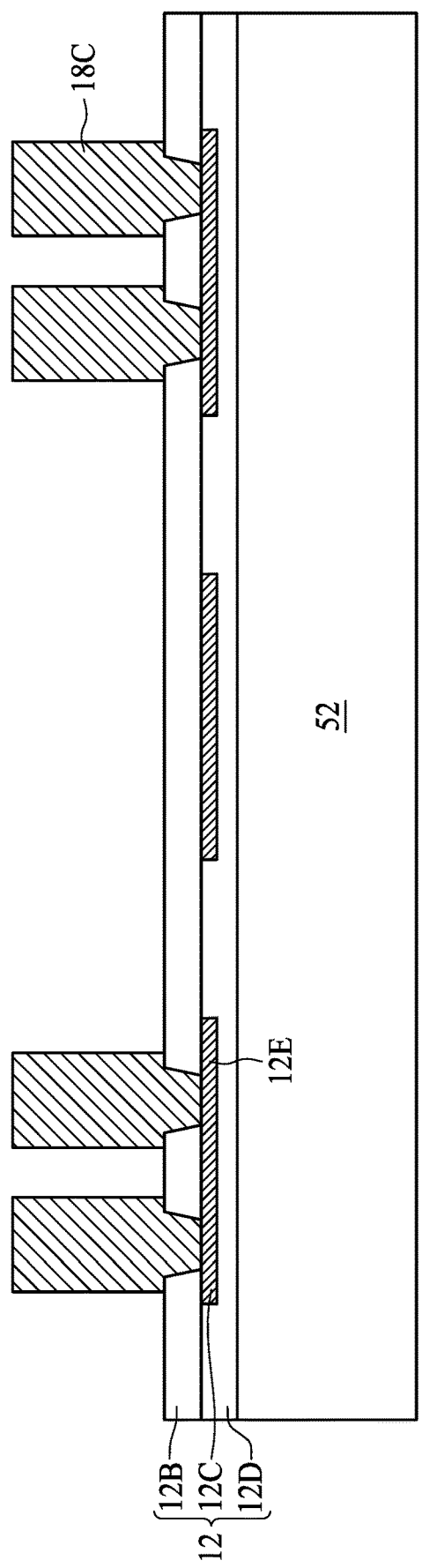

Referring to FIG. 2D, another dielectric layer 12B (also referred to as a bottom dielectric layer) may be formed on the circuit layer 12C, and the bottom dielectric layer 12B partially exposes the circuit layer 12C. Conductive structures 18C are formed on and electrically connected to the circuit layer 12C exposed from the bottom dielectric layer 12B. The conductive structures 18C may be formed by electroplating, deposition or other suitable techniques. In some embodiments, another alignment mark (not shown)

can be formed along with the first RDL 12 for facilitating a successive alignment operation.

Figure 2E:
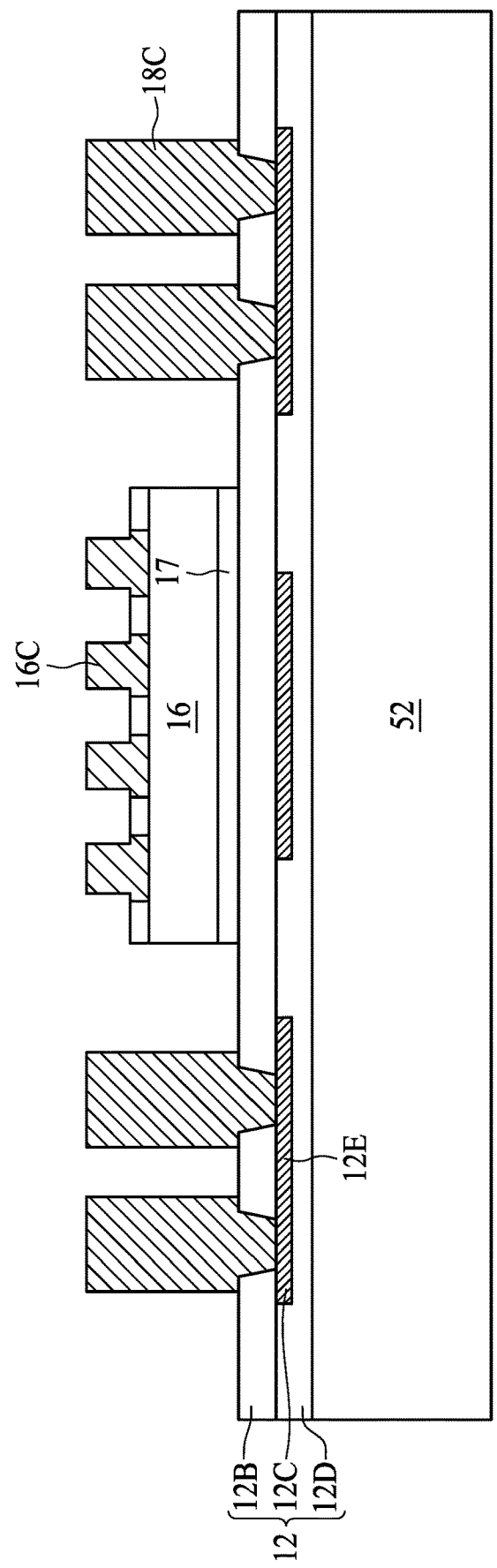
Figure 2F:
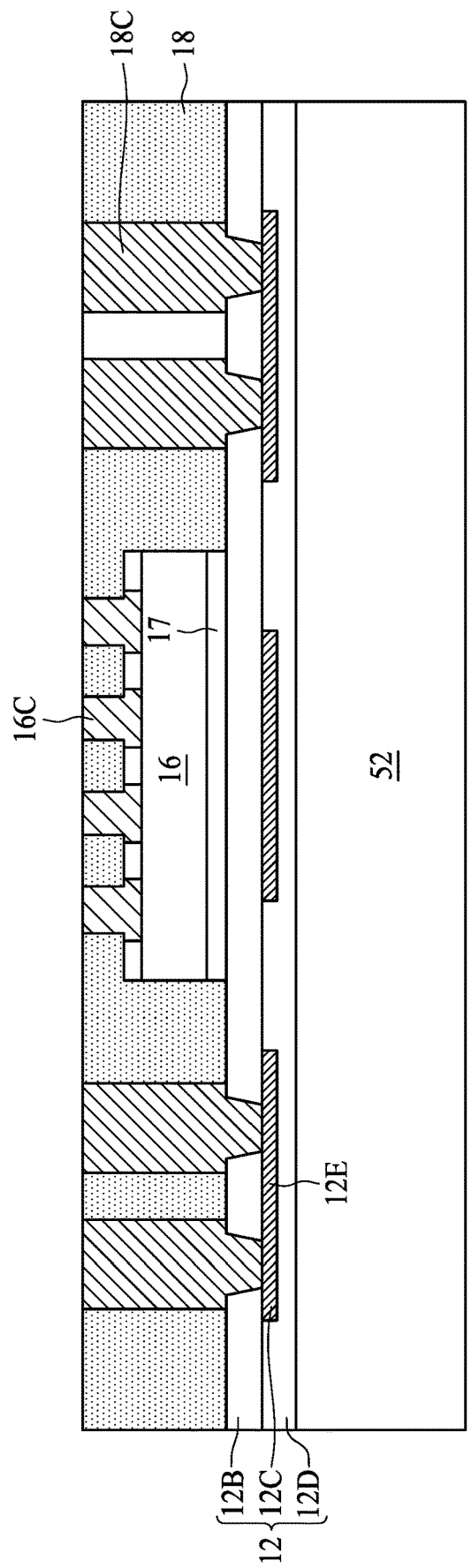

Referring to FIG. 2E, a semiconductor chip 16 is disposed on the first RDL 12. In some embodiments, the semiconductor chip 16 is attached to the first RDL 12, for example, by a die attach film 17, and the semiconductor chip 16 includes a plurality of connection elements 16C. Referring to FIG. 2F, an encapsulant 18 (also referred to as a second encapsulant) is formed on the first RDL 12 to encapsulate the semiconductor chip 16 and the conductive structures 18C. In some embodiments, the second encapsulant 18 may be partially removed, for example by grinding, to expose ends of the conductive structures 18C and the connection elements 16C.

Figure 2G:
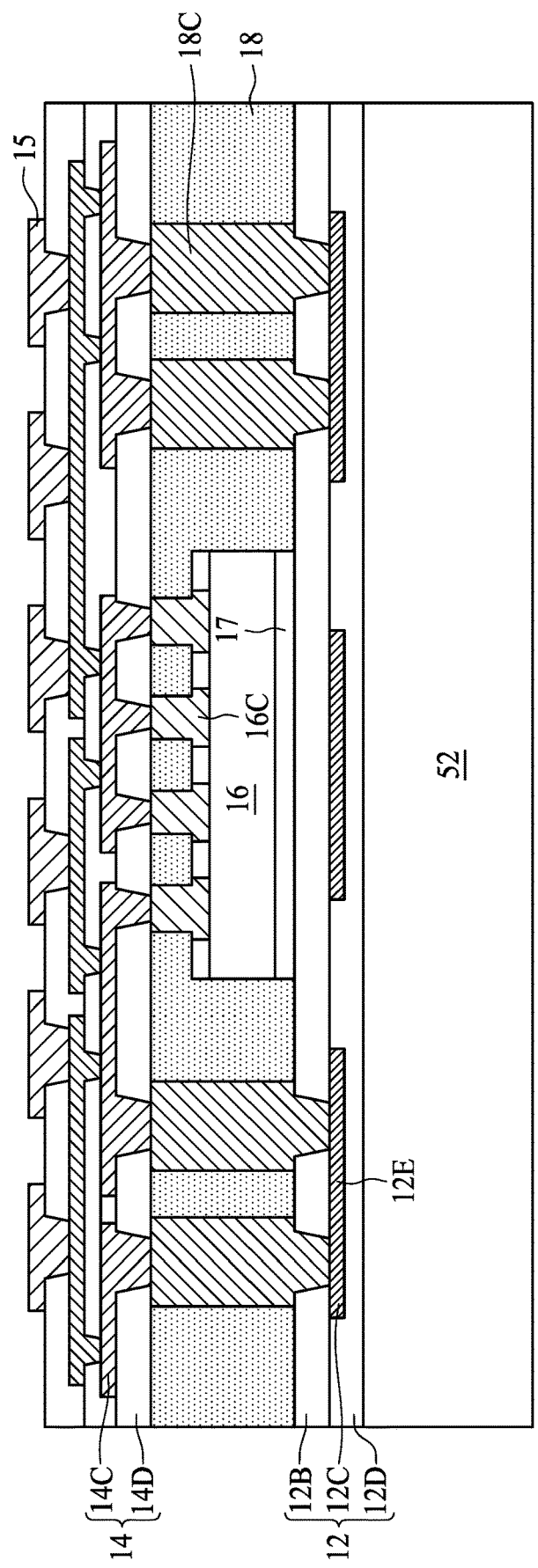

Referring to FIG. 2G, another RDL 14 (also referred to as a second RDL) is formed on the second encapsulant 18, and electrically connected to the conductive structures 18C and the connection elements 16C. The second RDL 14 includes, for example, a dielectric layer 14D and a circuit layer 14C disposed on, adjacent to, or embedded in and exposed by the dielectric layer 14D. The second RDL 14 may include a plurality of stacked circuit layers 14C and dielectric layers 14D. In some embodiments, conductive pads 15 such as UBMs may be formed on and electrically connected to the second RDL 14 for receiving other electrical components.

Figure 2H:
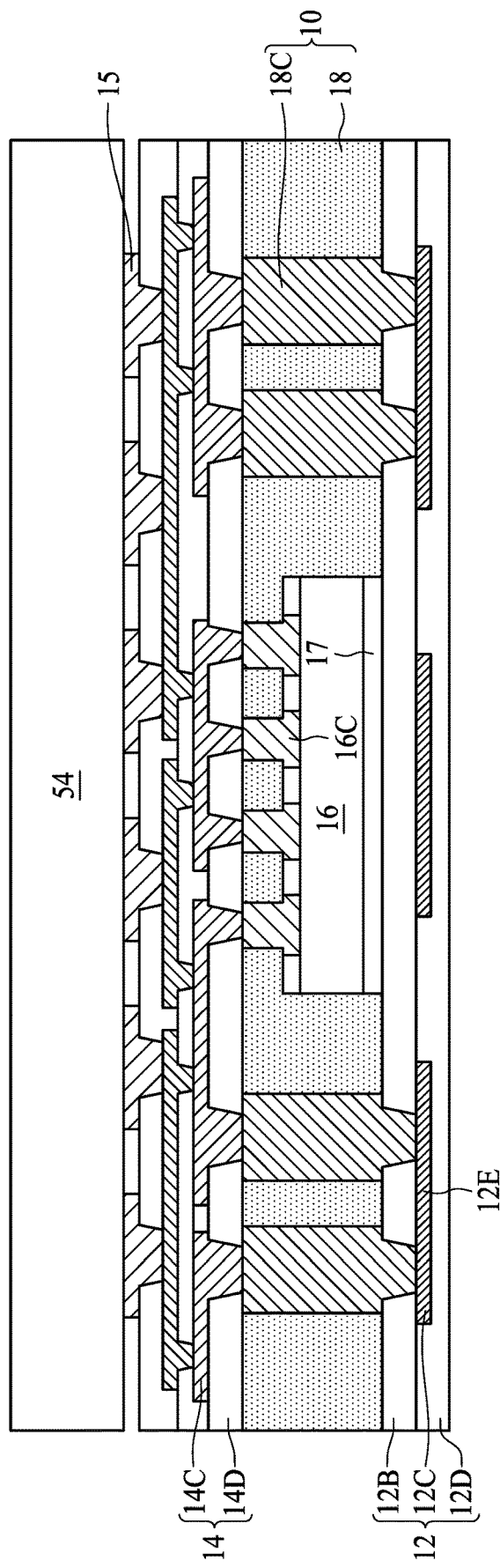

Referring to FIG. 2H, the second RDL 14 is bonded to another carrier 54 (also referred to as a second carrier), and the carrier 52 is removed from the first RDL 12 to expose the upper dielectric layer 12D. The carrier 54 may include, for example, a light-permeable carrier (e.g., that is about 80% or more transmissive to light, about 90% or more transmissive to light, or about 95% or more transmissive to light) such as a glass carrier. In some embodiments, the upper dielectric layer 12D is patterned to form first protrusions (e.g. as shown in FIG. 1A and FIG. 1B). Accordingly, one or a plurality of first electronic devices 10 (also referred to as a first molded structure) is formed. In some embodiments, the first molded structure may include a full molding structure, in which the dimension of the second encapsulant 18 may be substantially the same as that of the carrier 54. Although one first electronic device 10 is illustrated, and the first molded structure may include a plurality of first electronic devices 10.

Figure 2I:
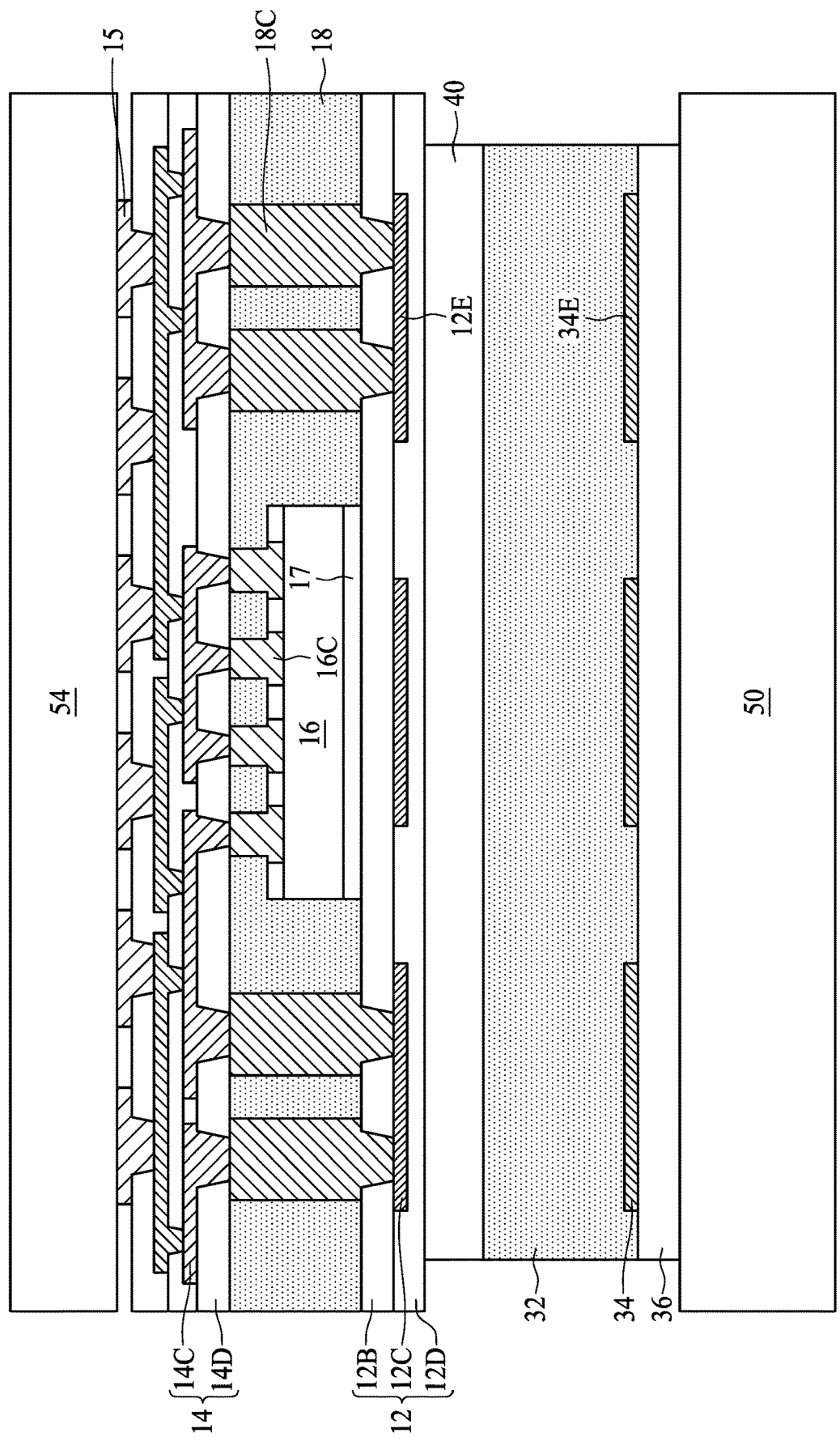

Referring to FIG. 2I, the first molded structure is bonded to the second molded structure by an adhesive layer (also referred to as an intermediate layer) 40 with the first encapsulant 32 facing the first RDL 12. The adhesive layer 40 may be softer or more malleable relative to the upper dielectric layer 12D, and thus the second protrusions can be formed to engage with the first protrusions of the upper dielectric layer 12D (as shown in FIG. 1B) to enhance adhesion when the first molded structure is bonded to the second molded structure. In some embodiments, the upper dielectric layer 12D is at least partially recessed to form a plurality of protrusions 12P and corresponding recesses, and (e.g., during a bonding operation) the adhesive layer 40 at least partially fills in the recesses of the upper dielectric layer 12D, thus forming a plurality of protrusions 40P in the adhesive layer 40 engaging with the protrusions 12P of the upper dielectric layer 12D.

In some embodiments, the adhesive layer 40 may be cured for example by thermal curing to harden the adhesive layer 40 and enhance the adhesion between the first molded structure and the second molded structure. In some embodiments, an alignment operation such as an optical alignment operation can be performed using an alignment mark (not shown) formed in the carrier 50 and an alignment mark (not shown) formed along with the first RDL 12 such that the first molded structure and the second molded structure can be well aligned. Accordingly, the first electrode 12E and the second electrode 34E can be well aligned, and an offset of an edge of at least one of the first electrodes 12E from a corresponding edge of a respective second electrode 34E (or an offset of an imaginary center line of the first electrode 12E from an imaginary center line of the second electrode 34E) can be controlled to be less than a predetermined value such as about 25 micrometers (or, for example, about 20 micrometers, about 17.5 micrometers, about 15 micrometers, or less). Therefore, electrical signals can be transmitted from the circuit layer 12C to the patterned conductive layer 34, or vice versa.

Figure 2J:
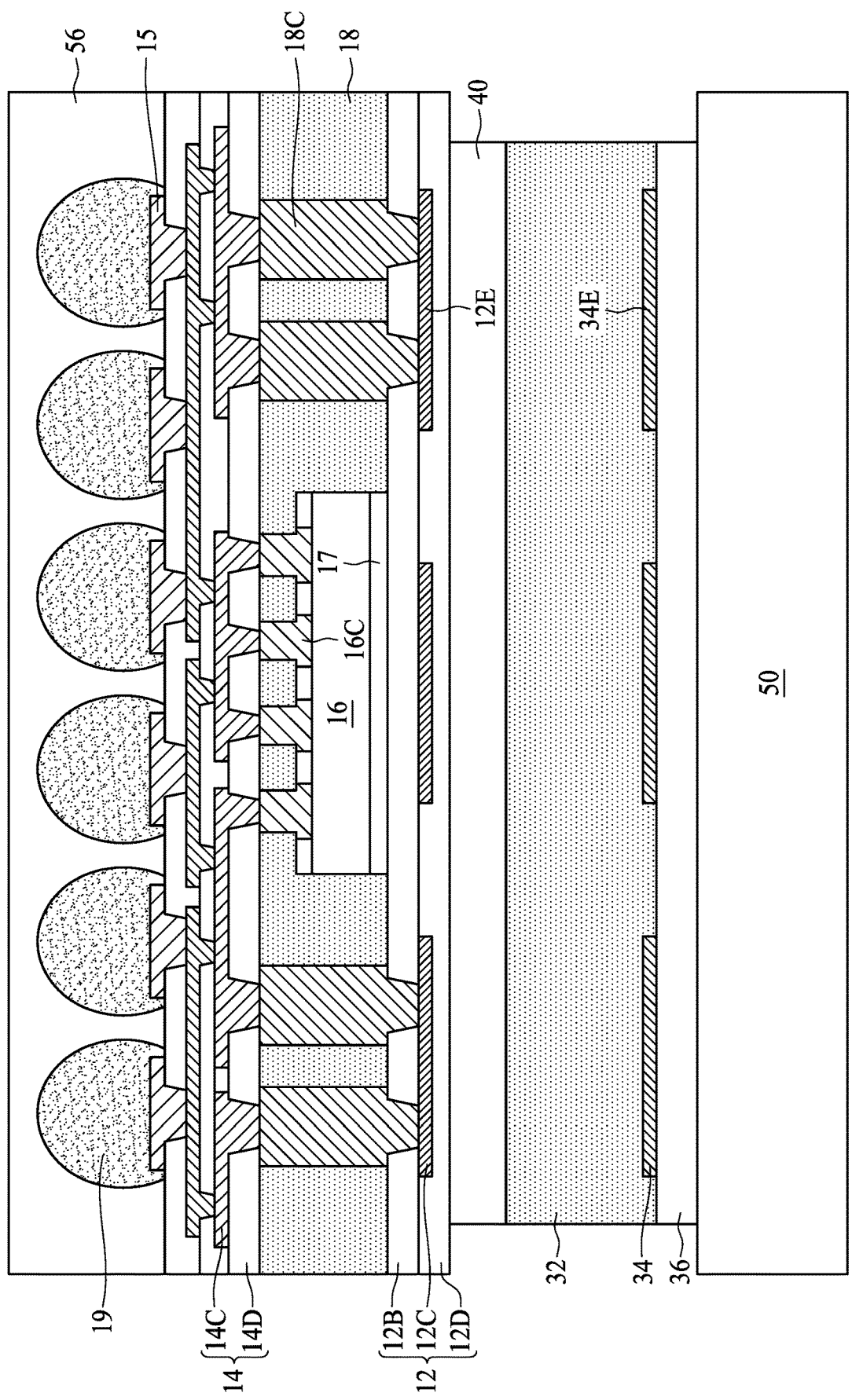

Referring to FIG. 2J, the carrier 54 is removed from the second RDL 14. Connectors 19 such as solder bumps are formed on and electrically connected to the second RDL 14 through conductive pads 15. The second RDL 14 is attached to a support 56 such as a dicing tape with the connectors 19 being covered.

Figure 2K:
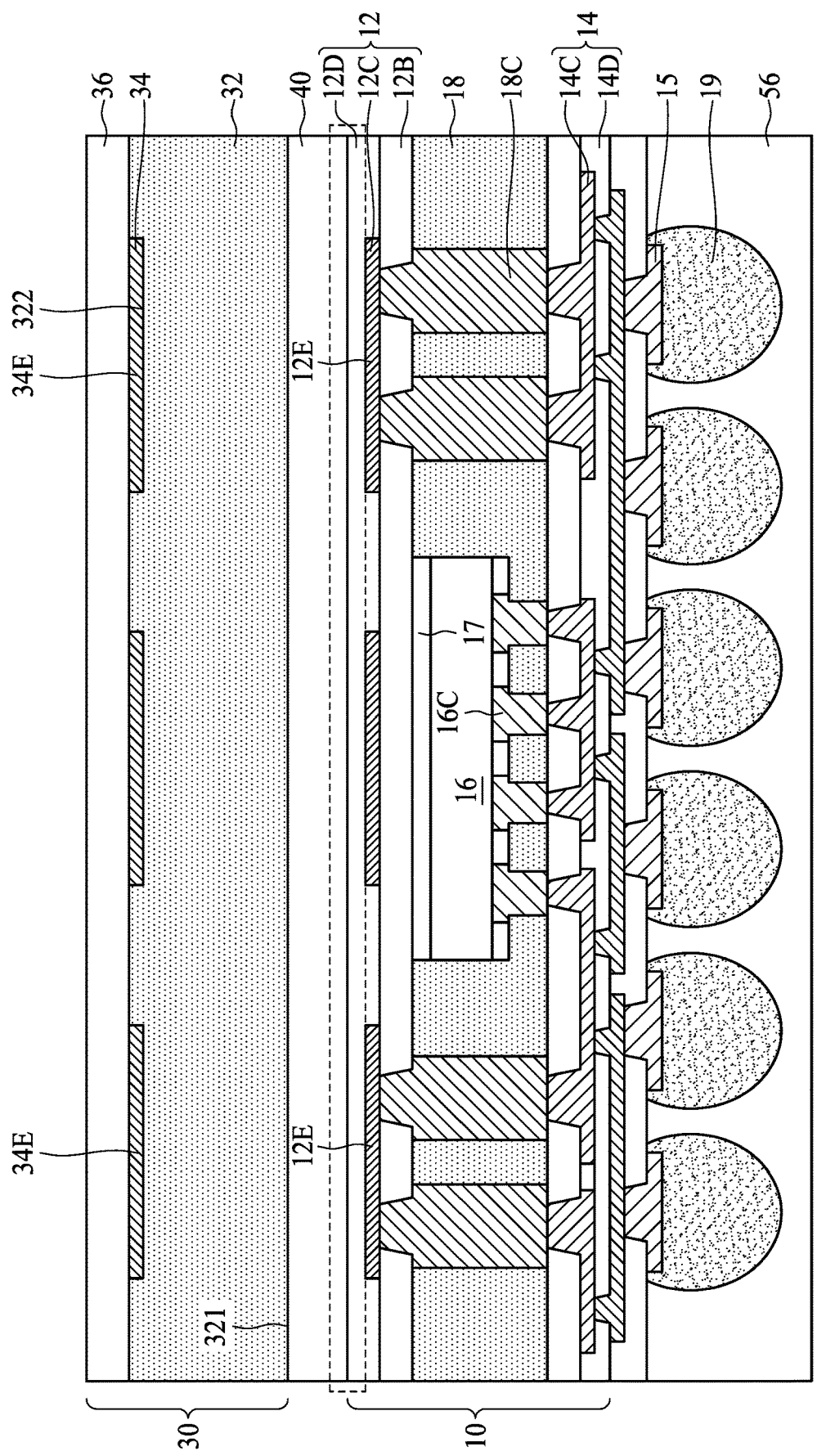

Referring to FIG. 2K, the first molded structure and the second molded structure are then flipped over, and the carrier 50 is removed from the second molded structure. A singulation operation is performed, and the support 56 is removed to form a semiconductor device package 1 as illustrated in FIG. 1.

The semiconductor device packages and manufacturing methods of the present disclosure are not limited to the above-described embodiments, and may be implemented according to other embodiments. To streamline the description and for the convenience of comparison between various embodiments of the present disclosure, similar components the following embodiments are marked with same numerals, and may not be redundantly described.

Figure 3:
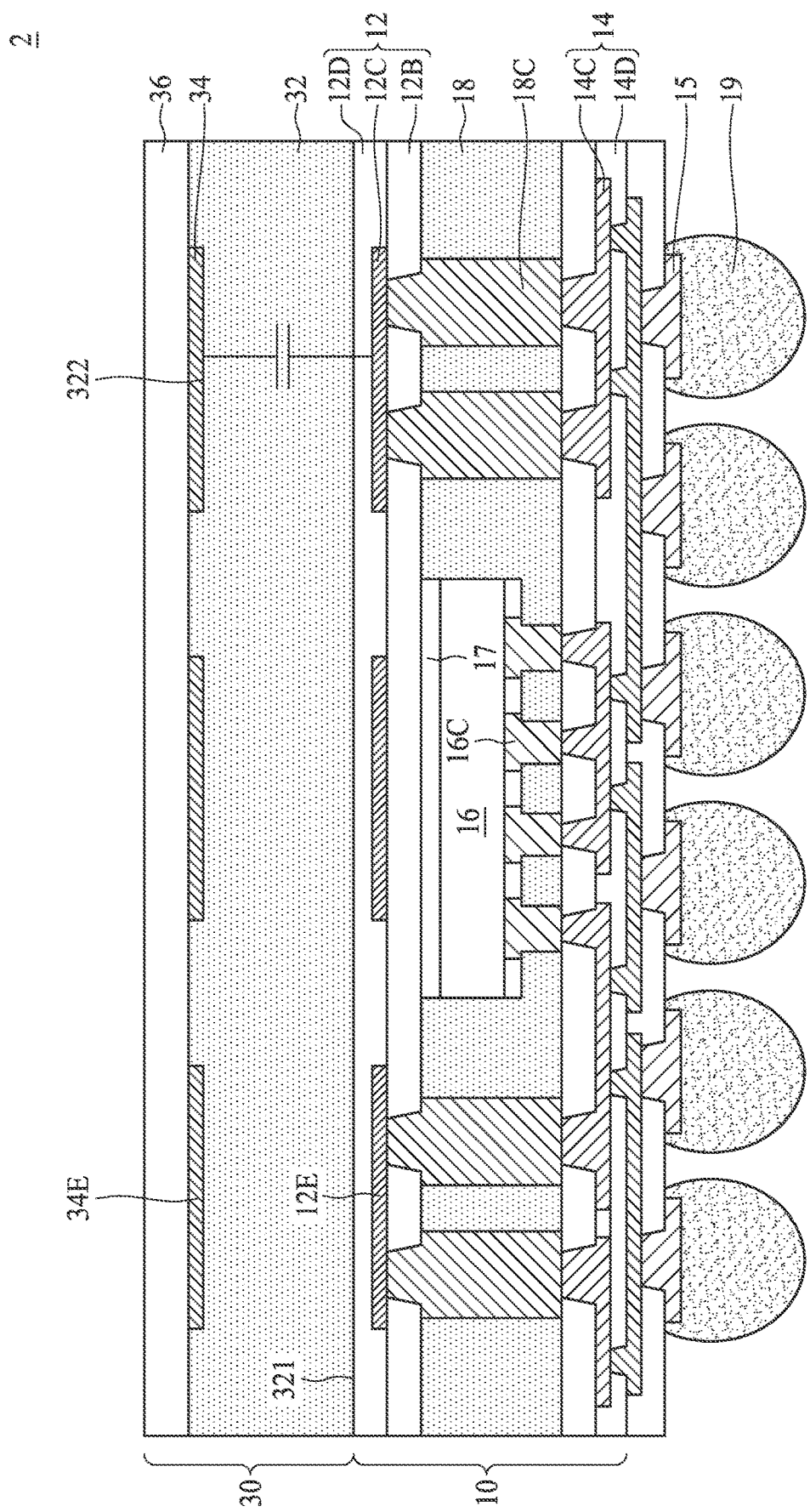
FIG. 3 is a cross-sectional view of a semiconductor device package in accordance with some embodiments of the present disclosure.

FIG. 3 is a cross-sectional view of a semiconductor device package 2 in accordance with some embodiments of the present disclosure. Referring to FIG. 3, in contrast to the semiconductor device package 1 of FIG. 1, the second electronic device 30 is disposed on the first electronic device 10 and omits an intermediate layer. For example, the upper dielectric layer 12D may be in contact with the first encapsulant 32. In some embodiments, the circuit layer 12C of the first electronic device 10 and the patterned conductive layer 34 of the second electronic device 30 may collectively form an antenna. For example, the patterned conductive layer 34 of the second electronic device 30 can be electrically coupled to the circuit layer 12C of the first electronic device 10. In some embodiments, the patterns of the circuit layer 12C and the patterned conductive layer 34 are substantially aligned. By way of example, the circuit layer 12C of the first RDL 12 includes a first electrode 12E, and the patterned conductive layer 34 includes a second electrode 34E substantially aligned with the first electrode 12E. In some embodiments, an offset of an edge of the first electrode 12E from a corresponding edge of the second electrode 34E (or an offset of an imaginary center line of the first electrode 12E from an imaginary center line of the second electrode 34E) is less than a predetermined value such as about 25 micrometers (or, for example, about 20 micrometers, about 17.5 micrometers, about 15 micrometers, or less), such that electrically signals can be propagated via coupling from the circuit layer 12C to the patterned conductive layer 34, or vice versa. In some embodiments, the dielectric constant (Dk) and the dissipation factor (Df) of the first encapsulant 32 and the second encapsulant 18 can be individually determined based on different considerations. By way of example, the dielectric constant (Dk) and/or the dissipation factor (Df) of the first encapsulant 32 disposed between the patterned conductive layer 34 and the circuit layer 12C is lower relative to that of the second encapsulant 18 (e.g., by a factor of about 0.9 or less, by a factor of about 0.8 or less, or by a factor of about 0.7 or less) to mitigate transmission loss.

Figure 4A:
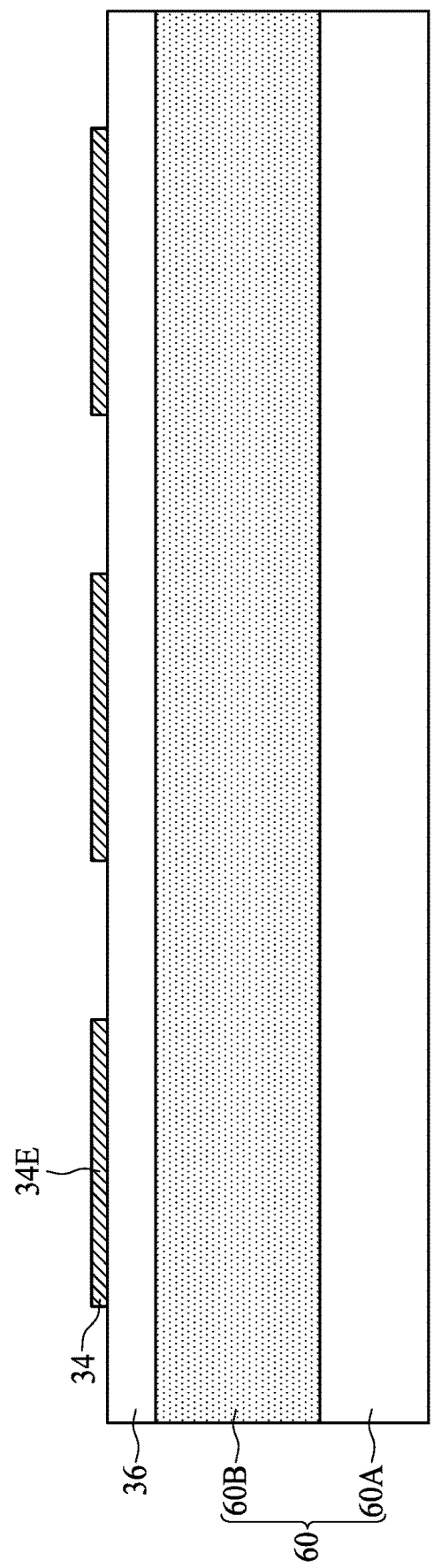
FIG. 4A, FIG. 4B, FIG. 4C, FIG. 4D, FIG. 4E, FIG. 4F, FIG. 4G, FIG. 4H and FIG. 4I illustrate operations of manufacturing a semiconductor device package in accordance with some embodiments of the present disclosure.

FIG. 4A, FIG. 4B, FIG. 4C, FIG. 4D, FIG. 4E, FIG. 4F, FIG. 4G, FIG. 4H and FIG. 4I illustrate operations of manufacturing a semiconductor device package in accordance with some embodiments of the present disclosure. Referring to FIG. 4A, a carrier 60 is provided. In some embodiments, the carrier 60 may include a substrate 60A such as a glass substrate or the like, and a releasing layer 60B such as a polymeric layer or the like. A passivation layer 36 may be formed on the carrier 60. A patterned conductive layer 34 is formed on the passivation layer 36.

Figure 4B:
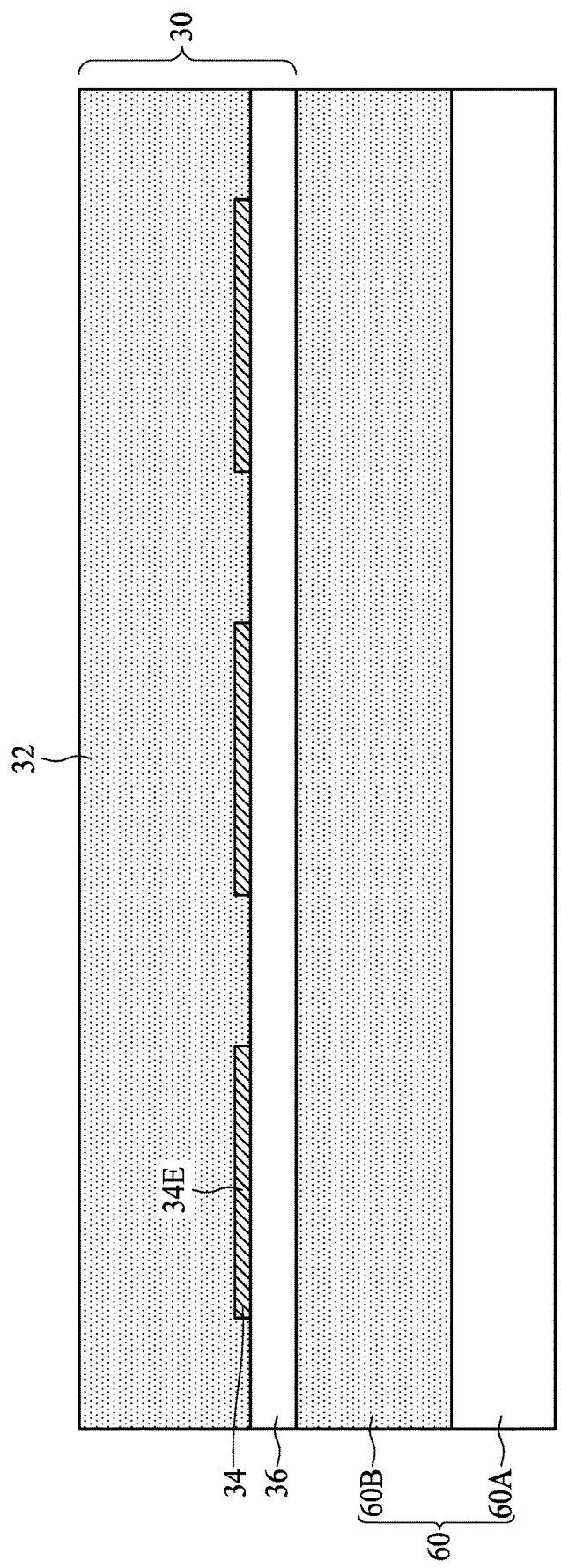

Referring to FIG. 4B, an encapsulant 32 (also referred to as a first encapsulant) is formed on the carrier 60 to encapsulate the patterned conductive layer 34. Accordingly, one or a plurality of second electronic devices 30 (also referred to as a second molded structure) is formed. Although one second electronic device 30 is illustrated, the second molded structure may include a plurality of second electronic devices 30.

Figure 4C:
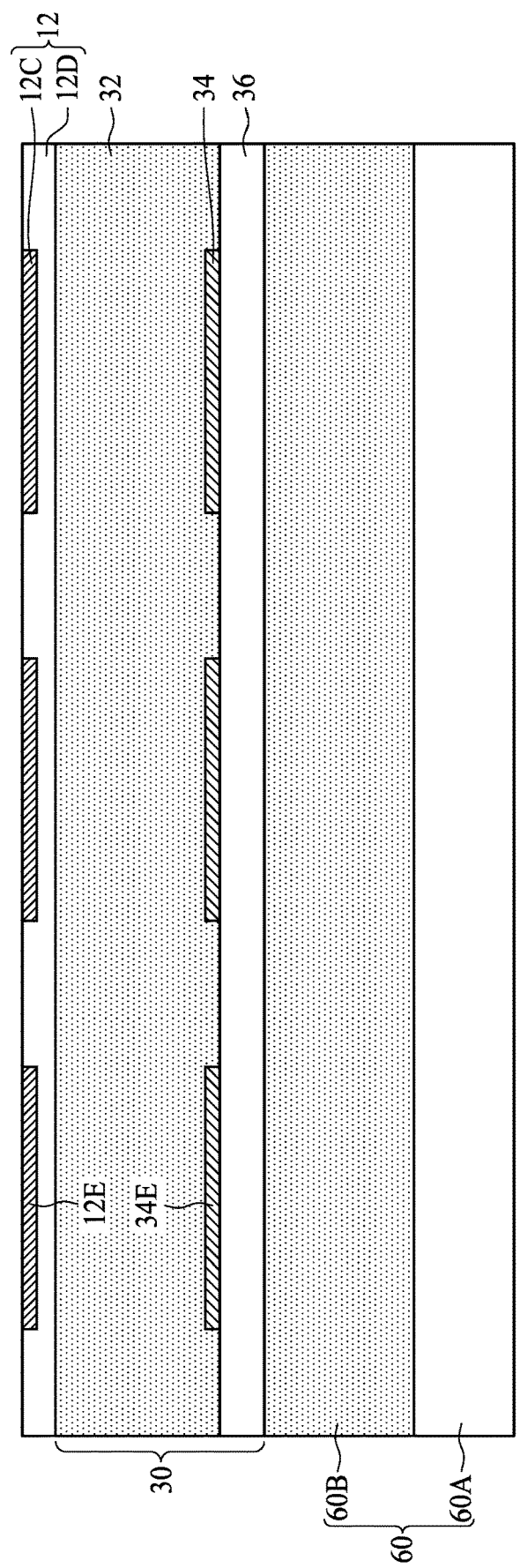
Figure 4D:
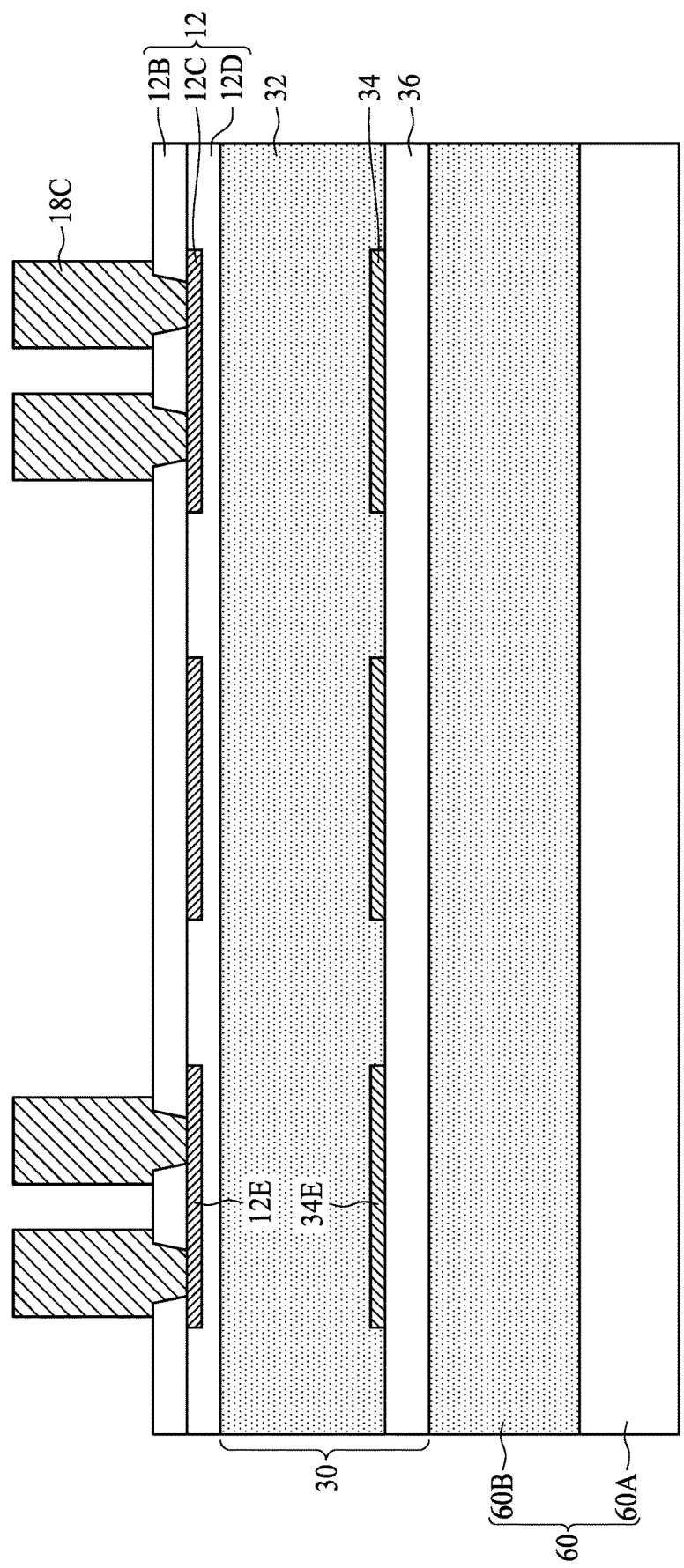

Referring to FIG. 4C, an RDL 12 (also referred to as a first RDL) is formed on the first encapsulant 32. In some embodiments, the first RDL 12 includes, for example, a dielectric layer 12D (also referred to an upper dielectric layer) and a circuit layer 12C disposed on, adjacent to, or embedded in and exposed by the dielectric layer 12D. Referring to FIG. 4D, another dielectric layer 12B (also referred to as a bottom dielectric layer) may be formed on the circuit layer 12C, and the bottom dielectric layer 12B partially exposes the circuit layer 12C. Conductive structures 18C are formed on and electrically connected to the circuit layer 12C exposed from the bottom dielectric layer 12B. The conductive structures 18C may be formed by electroplating, deposition or other suitable techniques.

Figure 4E:
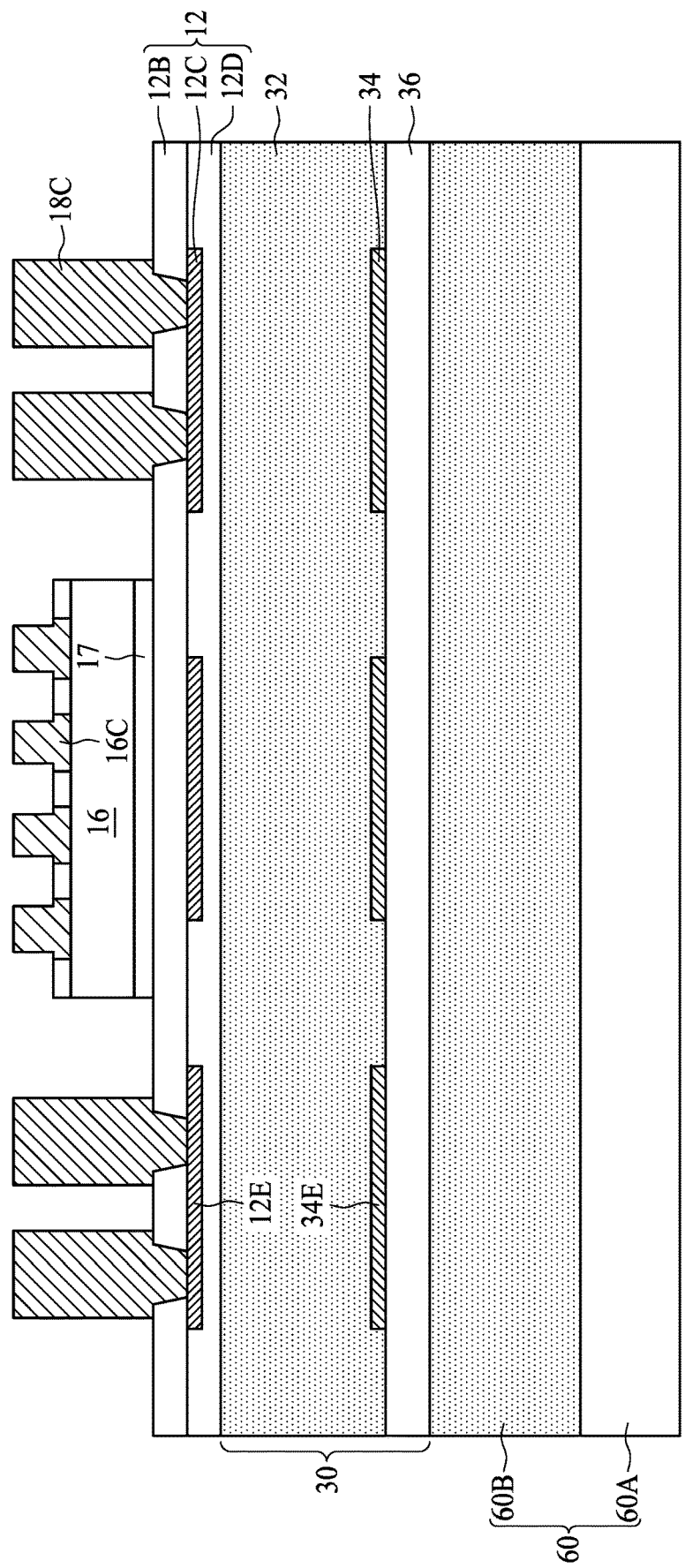
Figure 4F:
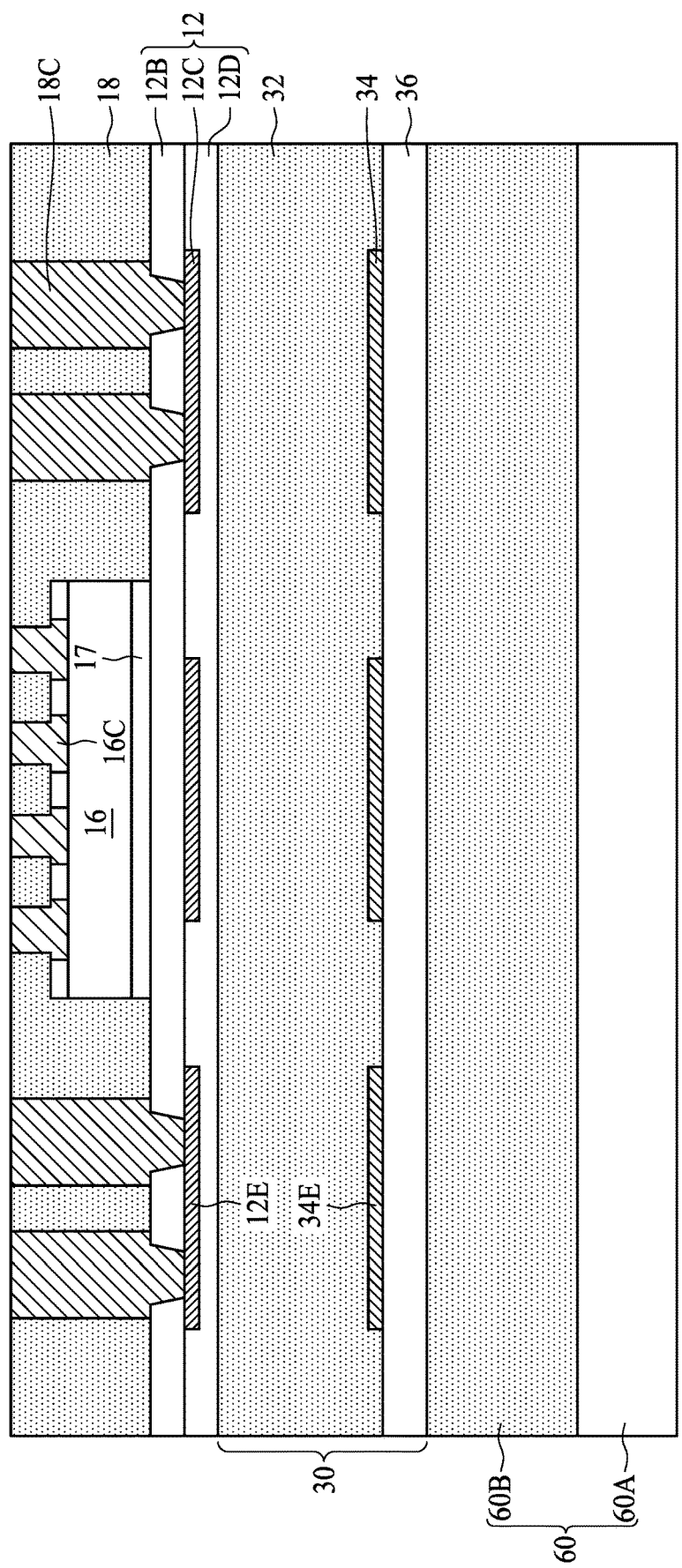

Referring to FIG. 4E, a semiconductor chip 16 is disposed on the first RDL 12. In some embodiments, the semiconductor chip 16 is attached to the first RDL 12, for example, by a die attach film 17, and the semiconductor chip 16 includes a plurality of connection elements 16C. Referring to FIG. 4F, an encapsulant 18 (also referred to as a second encapsulant) is formed on the first RDL 12 to encapsulate the semiconductor chip 16 and the conductive structures 18C. In some embodiments, the second encapsulant 18 may be partially removed, for example by grinding, to expose ends of the conductive structures 18C and the connection elements 16C.

Figure 4G:
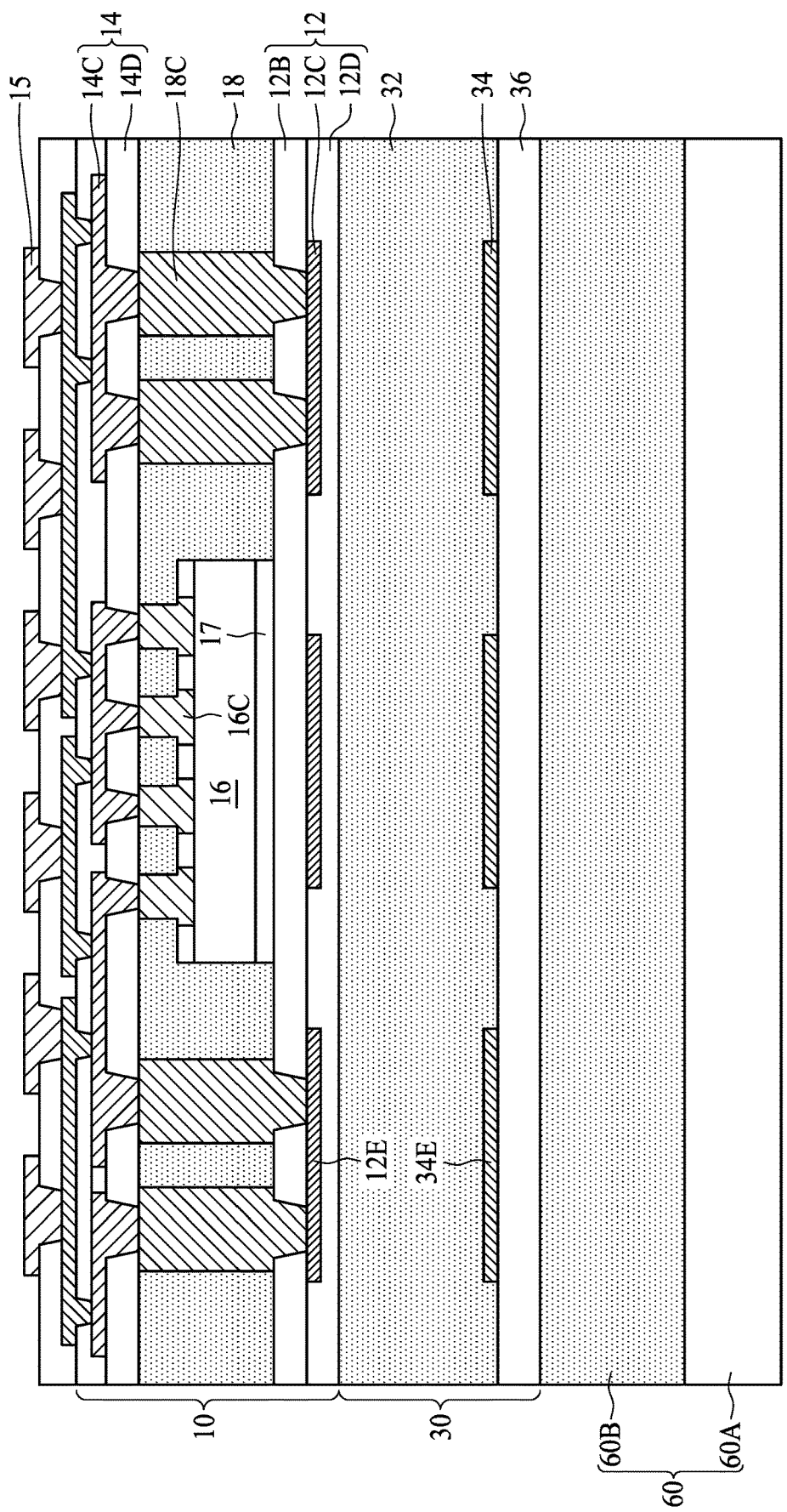

Referring to FIG. 4G, another RDL 14 (also referred to as a second RDL) is formed on the second encapsulant 18, and electrically connected to the conductive structures 18C and the connection elements 16C. The second RDL 14 includes, for example, a dielectric layer 14D and a circuit layer 14C disposed on, embedded in and exposed by, or adjacent to the dielectric layer 14D. In some embodiments, the second RDL 14 includes a plurality of stacked circuit layers 14C and dielectric layers 14D. In some embodiments, conductive pads 15 such as UBMs may be formed on and electrically connected to the second RDL 14 for receiving other electrical components.

Figure 4H:
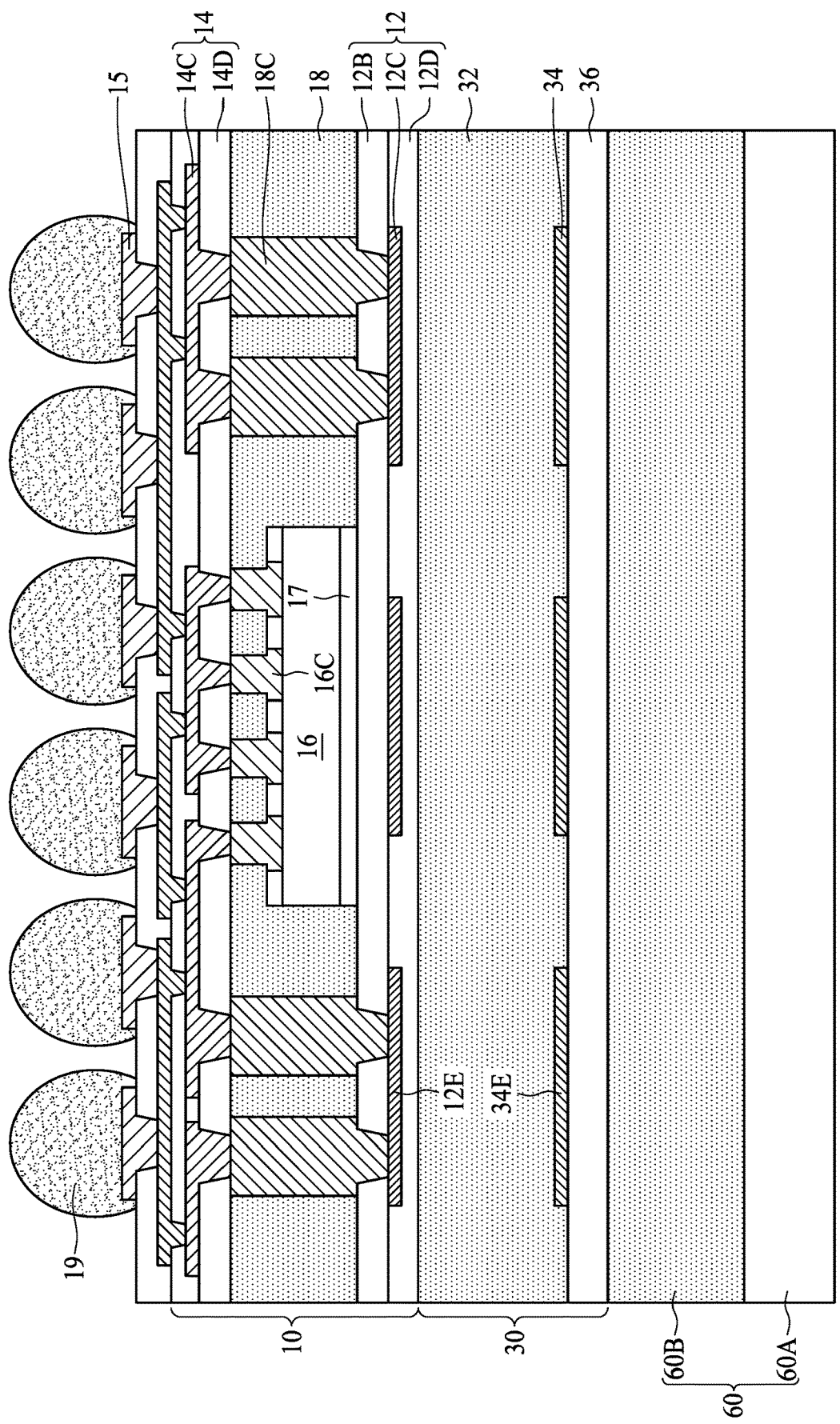
Figure 4I:
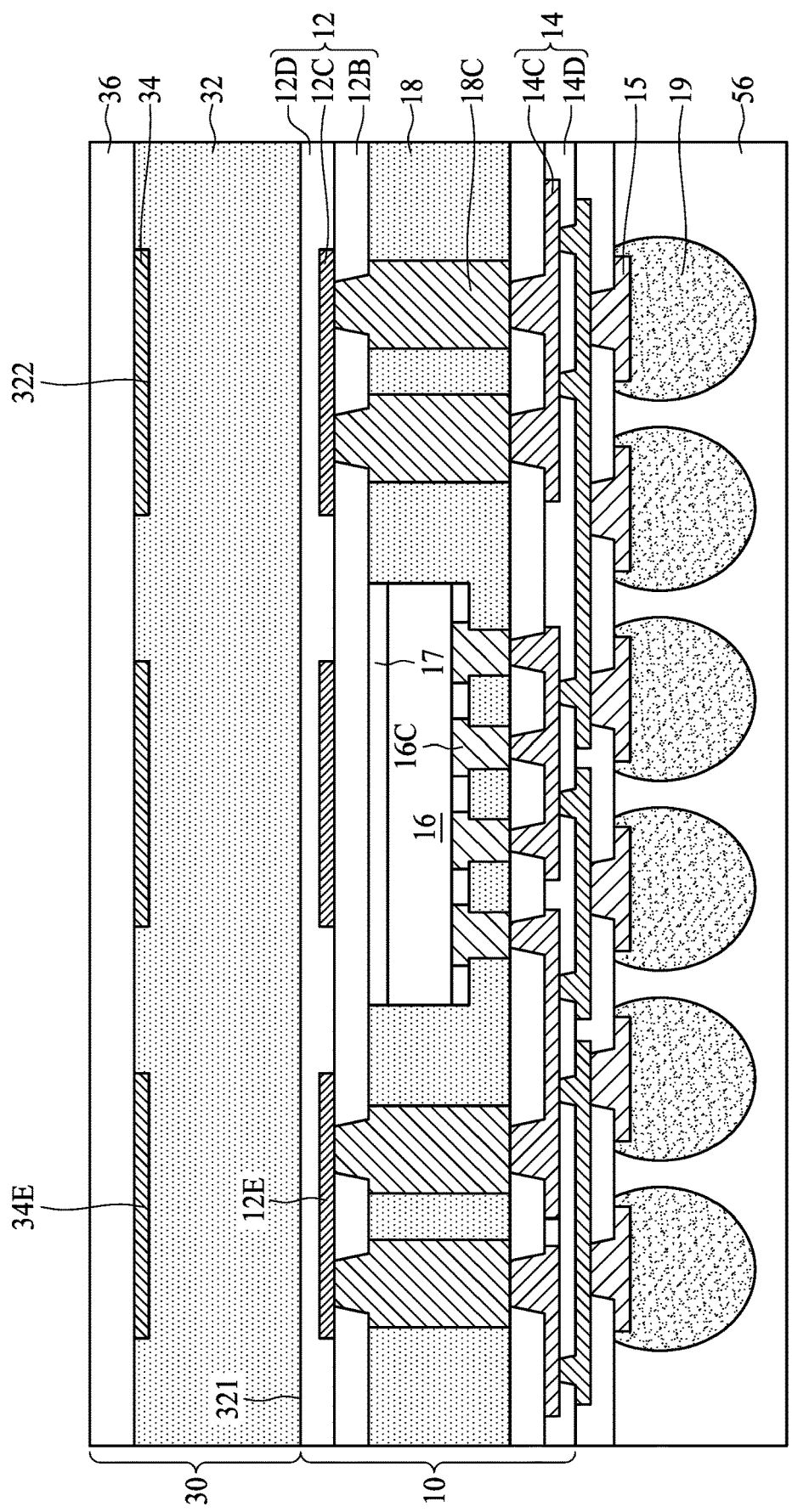

Referring to FIG. 4H, connectors 19 such as solder bumps are formed on and electrically connected to the second RDL 14 through conductive pads 15. Referring to FIG. 4I, the second RDL 14 is attached to a support 56 such as a dicing tape with the connectors 19 being covered, and the carrier 60 is removed from the passivation layer 36. A singulation operation is performed, and the support 56 is removed to form a semiconductor device package 2 as illustrated in FIG. 3.

In some embodiments of the present disclosure, the semiconductor device package includes two or more stacked electronic devices. The electronic devices may include but are not limited to molded structures, which are molded individually before they are bonded, and therefore each of the molded structures may be subjected to a single molding operation. Accordingly, warpage issue can be alleviated, and thus the electronic devices can be well aligned with each other when they are bonded.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
   a first electronic device comprising a first redistribution layer (RDL) including a circuit layer;
   a second electronic device disposed on the first RDL of the first electronic device, the second electronic device comprising:
      an encapsulant having a first surface facing the first RDL of the first electronic device, and a second surface opposite to the first surface; and
      a patterned conductive layer disposed at the second surface of the encapsulant, and configured to be electrically coupled to the circuit layer of the first RDL of the first electronic device; and
   an intermediate layer disposed between the first electronic device and the second electronic device, and configured to bond the first electronic device and the second electronic device,
   wherein the first electronic device includes a second encapsulant disposed between the first RDL and the second electronic device.

2. The semiconductor device package of claim 1, wherein the circuit layer of the first RDL is physically isolated from the patterned conductive layer by the encapsulant.

3. The semiconductor device package of claim 1, wherein the circuit layer of the first RDL includes a first electrode, and the patterned conductive layer includes a second electrode aligned with the first electrode.

4. The semiconductor device package of claim 3, wherein an offset of an edge of the first electrode from a corresponding edge of the second electrode is less than 25 micrometers.

5. The semiconductor device package of claim 1, wherein the first RDL further comprises an upper dielectric layer covering the circuit layer.

6. The semiconductor device package of claim 5, wherein the intermediate layer is disposed between the upper dielectric layer of the first RDL of the first electronic device and the first surface of the encapsulant.

7. The semiconductor device package of claim 6, wherein the upper dielectric layer of the first RDL includes a plurality of first protrusions, and the intermediate layer includes a plurality of second protrusions engaged with the first protrusions of the upper dielectric layer of the first RDL.

8. The semiconductor device package of claim 1, wherein the first electronic device further comprises:
   a second RDL disposed under the first RDL and electrically connected to the first RDL; and
   a semiconductor chip disposed between the first RDL and the second RDL;
   wherein the second encapsulant is disposed between the first RDL and the second RDL, and encapsulates the semiconductor chip.

9. The semiconductor device package of claim 8, wherein a surface roughness of the second RDL is less than a surface roughness of the first RDL.

10. The semiconductor device package of claim 1, further comprising a passivation layer disposed on the patterned conductive layer.

11. The semiconductor device package of claim 1, wherein the encapsulant comprises an opaque encapsulant.

12. The semiconductor device package of claim 1, wherein the patterned conductive layer is substantially coplanar with the second surface of the encapsulant.

13. A semiconductor device package, comprising:
   a first electronic device comprising a redistribution layer (RDL) including a circuit layer and an upper dielectric layer covering the circuit layer;
   a second electronic device disposed on the first electronic device, the second electronic device comprising:
      an encapsulant having a first surface, and a second surface opposite to the first surface; and
      a patterned conductive layer disposed at the first surface of the encapsulant; and
   an intermediate layer disposed between the upper dielectric layer of the RDL of the first electronic device and the second surface of the encapsulant, and configured to bond the first electronic device and the second electronic device,
   wherein the patterned conductive layer includes an antenna pattern, the antenna pattern at least partially overlaps the circuit layer of the RDL and is substantially coplanar with the first surface of the encapsulant.

14. The semiconductor device package of claim 13, wherein the circuit layer is physically isolated from the patterned conductive layer by the intermediate layer and the upper dielectric layer of the RDL.

15. The semiconductor device package of claim 13, wherein the circuit layer of the RDL includes a first electrode, and the patterned conductive layer includes a second electrode aligned with the first electrode.

16. The semiconductor device package of claim 13, wherein the upper dielectric layer of the RDL includes a plurality of first protrusions, and the intermediate layer includes a plurality of second protrusions engaged with the first protrusions of the upper dielectric layer of the RDL.

* * * * *